US012640726B2

(12) United States Patent
Ahmed et al.

(10) Patent No.: US 12,640,726 B2
(45) Date of Patent: May 26, 2026

(54) HIGH SIDE SWITCH GATE DRIVE APPARATUS AND CONTROL METHOD

(71) Applicant: Halo Microelectronics International, Campbell, CA (US)

(72) Inventors: Muhammad Ahmed, Garland, TX (US); Wenchao Qu, Plano, TX (US)

(73) Assignee: Halo Microelectronics International, Campbell, CA (US)

( * ) Notice: Subject to any disclaimer, the term of this patent is extended or adjusted under 35 U.S.C. 154(b) by 117 days.

(21) Appl. No.: 18/386,965

(22) Filed: Nov. 3, 2023

(65) Prior Publication Data

US 2025/0150072 A1 May 8, 2025

(51) Int. Cl.
H03K 17/082 (2006.01)
H03K 17/284 (2006.01)

(52) U.S. Cl.
CPC ....... H03K 17/0822 (2013.01); H03K 17/284 (2013.01); *H03K 2217/0063* (2013.01)

(58) Field of Classification Search
CPC .......................... H03K 17/0822; H03K 17/284
See application file for complete search history.

(56) References Cited

U.S. PATENT DOCUMENTS

| | | | | |
|---|---|---|---|---|
| 5,438,290 | A * | 8/1995 | Tanaka | G09G 3/2965 327/108 |
| 5,512,801 | A * | 4/1996 | Nilssen | H05B 41/28 315/241 R |
| 5,744,915 | A * | 4/1998 | Nilssen | H02M 7/53862 315/DIG. 5 |
| 6,459,213 | B1 * | 10/2002 | Nilssen | H02M 7/53832 315/DIG. 4 |
| 7,560,971 | B2 * | 7/2009 | Heikkila | H03K 19/018521 327/333 |
| 8,446,185 | B2 * | 5/2013 | Nakahara | H03K 19/007 327/108 |
| 8,471,642 | B2 * | 6/2013 | Hill | H03J 1/0008 331/117 FE |
| 8,890,603 | B2 * | 11/2014 | Mitsuda | H03K 19/017509 327/108 |
| 9,831,856 | B2 * | 11/2017 | Schindler | H03K 17/04123 |
| 9,955,561 | B2 * | 4/2018 | Pickett | H05B 41/2806 |
| 9,966,837 | B1 * | 5/2018 | Seaton | H02M 1/32 |
| 10,613,560 | B2 * | 4/2020 | Tsai | H03F 1/56 |
| 11,018,670 | B2 * | 5/2021 | Moctezuma | H03K 19/0005 |
| 11,063,589 | B1 * | 7/2021 | Mweene | H03K 17/08122 |

(Continued)

*Primary Examiner* — Menatoallah Youssef
*Assistant Examiner* — Khareem E Almo
(74) *Attorney, Agent, or Firm* — AP3 Law Firm PLLC

(57) ABSTRACT

An apparatus includes a high side switch connected between an input voltage bus and a load terminal, the load terminal being configured to be coupled to a load, a high side gate drive circuit configured to generate a gate drive signal for the high side switch, and a resonance suppression circuit having a first terminal connected to a gate of the high side switch, and a second terminal connected to the load terminal, wherein after a predetermined delay counting from a falling edge of an enable signal applied to the high side gate drive circuit, the resonance suppression circuit is configured to be active, and after a voltage on the load terminal rises above a ground voltage potential for a first time, the resonance suppression circuit is configured to pull a voltage on the gate of the high side switch down to a low voltage.

21 Claims, 15 Drawing Sheets

(56) References Cited

U.S. PATENT DOCUMENTS

| | | | | |
|---|---|---|---|---|
| 11,329,548 | B2 * | 5/2022 | McLean ............ | H02M 3/33573 |
| 12,132,305 | B1 * | 10/2024 | Qu ........................... | H02H 3/18 |
| 2013/0293135 | A1 * | 11/2013 | Hu ......................... | H05B 45/38 |
| | | | | 327/79 |
| 2015/0092307 | A1 * | 4/2015 | Petruzzi ................. | H02H 9/041 |
| | | | | 361/56 |
| 2017/0194953 | A1 * | 7/2017 | Huang ..................... | A61B 8/44 |
| 2020/0304108 | A1 * | 9/2020 | Bondar ................. | H03F 3/2173 |
| 2022/0400747 | A1 * | 12/2022 | Liu ......................... | A24F 40/05 |
| 2024/0267039 | A1 * | 8/2024 | Asano ............. | H03K 17/08142 |

* cited by examiner 1301        1303

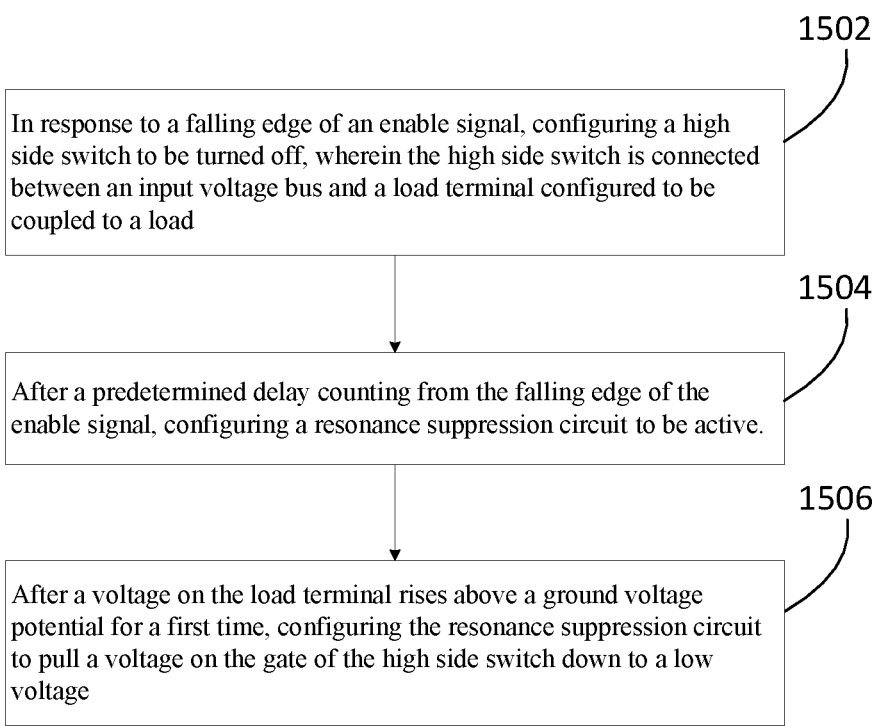

1502

In response to a falling edge of an enable signal, configuring a high side switch to be turned off, wherein the high side switch is connected between an input voltage bus and a load terminal configured to be coupled to a load

1504

After a predetermined delay counting from the falling edge of the enable signal, configuring a resonance suppression circuit to be active.

1506

After a voltage on the load terminal rises above a ground voltage potential for a first time, configuring the resonance suppression circuit to pull a voltage on the gate of the high side switch down to a low voltage

Figure 15

HIGH SIDE SWITCH GATE DRIVE APPARATUS AND CONTROL METHOD

TECHNICAL FIELD

The present invention relates to a high side switch gate drive apparatus and control method, and, in particular embodiments, to a resonance suppression circuit for reliably turning off a high side switch during a transition from an active mode to a standby mode.

BACKGROUND

As technologies further advance, semiconductor switches such as high side switches have gradually replaced mechanical switches, relays and fuses in automotive systems. High side switches are primarily used to control and manage power distribution in vehicles. High side switches are often employed in applications such as turning on and off automotive lighting, managing power supplied to electronic components like sensors and actuators, and safeguarding against short circuit and overcurrent conditions. High side switches provide a convenient and efficient solution to control electrical circuits, thereby enhancing safety, improving energy efficiency, and achieving overall functionality in modern automobiles.

In operation, the high side switch is configured to connect a load to a power supply or disconnect the load from the power supply. The high side switch may be controlled by an external signal. When the high side switch is turned off, the high side switch is able to block current from flowing from the power supply to the load. On the other hand, when the high side switch is turned on, a conductive path is established between the load and the power supply. The output voltage is approximately equal to the input voltage of the high side switch. The high side switch may be implemented as a discrete switch such as a metal-oxide-semiconductor field-effect transistor (MOSFET). Alternatively, the high side switch may be implemented as a fully integrated IC high side switch.

FIG. 1 illustrates a high side switch Q1 and the associated high side gate drive circuit. A high side switch Q1 is connected between an input voltage bus $V_{BB}$ and a load terminal $V_{OUT}$. As shown in FIG. 1, the high side switch Q1 is implemented as an n-type MOSFET. A drain of Q1 is connected to the input voltage bus $V_{BB}$, and a source of Q1 is connected to the load terminal $V_{OUT}$. A body diode BD1 is connected between the drain and source of Q1. The capacitance between the gate and drain of Q1 is denoted as Cgd as shown in FIG. 1. The capacitance between the gate and source of Q1 is denoted as Cgs as shown in FIG. 1. The parasitic capacitance between the load terminal $V_{OUT}$ and ground is denoted as Cp as shown in FIG. 1.

A load is connected to the load terminal $V_{OUT}$. The load is an inductive load including a resistor and an inductor connected in series between the load terminal $V_{OUT}$ and ground. The gate of Q1 is controlled by the high side gate drive circuit. The high side gate drive circuit comprises a first current source Ic, a first bias switch Sb1, a second bias switch Sb2 and a second current source Id coupled in series between a bias voltage bus $V_{CP}$ and the load terminal $V_{OUT}$. The first current source Ic is also known as a pull-up current source. The second current source Id is also known as a pull-down current source. The voltage on $V_{CP}$ is generated by a suitable bias circuit such as a charge pump circuit. The voltage on $V_{CP}$ is greater than the voltage on the input voltage bus $V_{BB}$.

A Zener diode Zg and a gate drive resistor $R_{GS}$ are connected in series between the input voltage bus $V_{BB}$ and the load terminal $V_{OUT}$. As shown in FIG. 1, a common node of the first bias switch Sb1 and the second bias switch Sb2 is connected to the gate of the high side switch Q1. A common node of the Zener diode Zg and the gate drive resistor $R_{GS}$ is also connected to the gate of the high side switch Q1. The common node of the Zener diode Zg and the gate drive resistor $R_{GS}$ is denoted as Vg as shown in FIG. 1.

As shown in FIG. 1, the first bias switch Sb1 is controlled by an enable signal EN. The second bias switch Sb2 is controlled by an inverting signal of the enable signal EN. In operation, when the high side switch Q1 is enabled to provide power to the load, the first bias switch Sb1 is turned on by the enable signal EN. Once the first bias switch Sb1 is turned on, the first current source Ic charges the gate of Q1 to a voltage level greater than or equal to the sum of the voltage on the input voltage bus $V_{BB}$ and the turn-on voltage threshold ($\Delta V$) of Q1. In other words, the gate-source voltage of Q1 is greater than or equal to the turn-on voltage threshold ($\Delta V$) of Q1. Consequently, Q1 is turned on to provide power to the load. Once Q1 is turned on, the high side switch Q1 operates in an active mode.

In operation, when the high side switch Q1 is configured to be disabled from providing power to the load, the first bias switch Sb1 is turned off and the second bias switch Sb2 is turned on by the inverted signal of the enable signal EN. Once the second bias switch Sb2 is turned on, the second current source Id discharges the gate of Q1 to a voltage level equal to zero with reference to the voltage on the load terminal $V_{OUT}$. In other words, the gate-source voltage of Q1 is reduced to zero. Consequently, Q1 is turned off. As a result, current is prevented from flowing from the input voltage bus $V_{BB}$ to the load. Once Q1 is turned off, the high side switch Q1 operates in a standby mode.

The gate drive resistor $R_{GS}$ is used such that when the high side switch Q1 is in the standby mode and the active pull-down current source (e.g., Id) is not available, the gate drive resistor $R_{GS}$ can make sure that the high side switch Q1 is still turned off. In practice, the resistance of the gate drive resistor $R_{GS}$ is in a range from about 100 kf to about 300 kf. However, this small resistance value of $R_{GS}$ makes the design of the current limit of Q1 more complicated and challenging. To relax the design of the current limit of Q1, the resistance value of $R_{GS}$ has to increase to a few Mega Ohms. However, higher resistance values of $R_{GS}$ weaken the passive pull down of Q1 and make this pull-down process less effective. In some applications having an inductor or a combination of an inductor and a resistor as a load, after the high side switch Q1 is disabled and Q1 enters to the standby mode, the gate drive resistor $R_{GS}$ having a high resistance value cannot reliably turn off Q1. This causes issues when the load connected to the high side switch is inductive as shown in FIG. 1.

FIG. 2 illustrates various waveforms associated with the high side gate drive circuit shown in FIG. 1. The horizontal axis of FIG. 2 represents intervals of time. There may be three rows in FIG. 2. The first row represents the enable signal EN. The second row represents the output voltage Vo on the load terminal $V_{OUT}$. The third row represents the output current $I_{OUT}$ flowing through the load.

The various waveforms shown in FIG. 2 illustrates the transient response of the high side switch Q1 when the load is an inductive load and the system (Q1 and the associated control circuits) transitions from an active mode to a standby mode.

At t0, the enable signal EN has a logic high level. The high side switch Q1 is fully turned on. Since Q1 is fully turned on, the output voltage Vo is approximately equal to the voltage on the input voltage bus $V_{BB}$. Power is provided to the inductive load from $V_{BB}$. The current flowing into the inductive load is $I_{OUT}$. The gate terminal of the high side switch Q1 is biased by the first current source Ic. The voltage on the gate terminal is equal to the sum of the voltage on $V_{BB}$ and $\Delta V$. $\Delta V$ is the turn-on threshold of the high side switch Q1. As shown in FIG. 2, the system reaches a steady state in the active mode.

At t1, the enable signal EN changes from a logic high level to a logic low level. In response to this logic change, the high side switch Q1 is configured to be turned off by discharging the gate terminal (Vg) using the second current source Id and $R_{GS}$. Once the gate terminal has been discharged, the high side switch Q1 starts to be turned off. At the same time, the inductive load starts to source current from parasitic capacitances (e.g., Cp shown in FIG. 1) in order to sustain the load current $I_{OUT}$. Once the parasitic capacitances are discharged by the inductive load, the output voltage $V_{OUT}$ starts to drop quickly and the load current $I_{OUT}$ starts to droop from t1 to t2.

At t2, the output voltage Vo drops to a voltage level below zero, and further drops to a voltage level equal to −Vclamp as shown in FIG. 2. Once the output voltage Vo becomes too low, the clamping mechanism of the Zener diode Zg becomes active. As the Zener diode Zg starts to breakdown, it supports a current to flow from $V_{BB}$ to Vg, and then to the load terminal $V_{OUT}$. This breakdown current flows through $R_{GS}$ to establish a bias voltage across the gate and source terminals of the high side switch Q1. This bias voltage turns on the high side switch Q1. An equilibrium is reached at t2.

From t2 to t3, the output voltage Vo remains at a negative voltage level. The load current reduces linearly with a slope equal to (Vo/L). L is the equivalent series inductance of the inductive load. As the load current $I_{OUT}$ reduces in a linear manner, the gate-source bias voltage of the high side switch Q1 required to provide the load current is also reduced. As a result, the output voltage Vo slowly increases. During this time period, the parasitic capacitances (e.g., Cp) is also charged to the negative voltage (−Vclamp).

At t3, the load current $I_{OUT}$ reduces to zero. This means no current is required to flow through the high side switch Q1 and its biasing resistor $R_{GS}$. As a result, the high side switch Q1 is turned off for the first time. After the load current $I_{OUT}$ crosses zero, it continues to drop further to become a negative current. This is due to the parasitic capacitance at the load terminal (e.g., Cp). More particularly, Cp starts to discharge through the inductive load, forming an L-C resonance. As a result, with the turned-off Q1, the output voltage Vo quickly rises from t3 to t4. The output voltage Vo crosses zero as the parasitic capacitance Cp completes its discharge into the inductive load, and the inductive load starts to discharge. The output voltage Vo reaches its peak voltage when $I_{OUT}$ crosses zero again at t4. The peak voltage of the output voltage Vo at t4 could be as high as the sum of voltage on $V_{BB}$ and $V_{BD}$. $V_{BD}$ is the forward biasing voltage drop across the body diode BD1 of the high side switch Q1. In the L-C resonance, the energy is discharged into the supply $V_{BB}$.

After t4, the output voltage $V_{OUT}$ starts to drop again as the inductive load tries to provide a source current to sustain the resonance current. At this point, the high side switch Q1 is turned on again to provide the load current. Specifically, another equilibrium is reached as the output voltage $V_{OUT}$ drops linearly from t4 to t5. The rate at which the output voltage $V_{OUT}$ drops is used to generate just the right current through the parasitic capacitance between the drain and the gate of Q1 such that a sufficient bias voltage can be established across the relatively large $R_{GS}$ to adequately turn on the high side switch Q1 to sustain the varying load current $I_{OUT}$. During this process, the output voltage $V_{OUT}$ crosses zero as the output current reaches another peak. During this process, the inductive load completes the process of discharging the magnetic energy stored in it to the parasitic capacitances (e.g., Cp) at the load terminal, and the parasitic capacitance starts to discharge the electric energy stored in it to the inductive load again, which leads to the decrease of the load current $I_{OUT}$.

At t5, the load current $I_{OUT}$ reduces to zero again. As there is no current required to be carried by the high side switch Q1 and its parasitic biasing path, the high side switch Q1 is turned off for a second time. Then, the resonance cycle starts again. As shown in FIG. 2, the output voltage Vo reaches another peak at t6. Then, the high side switch Q1 will be turned on again to sustain the load current $I_{OUT}$. In certain scenarios, this resonance will continue for a significant number of cycles. The peak value the output voltage Vo reaches or exceeds the voltage on $V_{BB}$. This is a hazardous operating condition for the system. It would be desirable to have a resonance suppression circuit to reduce or eliminate the L-C resonance so as to protect the system from being damaged. The present disclosure addresses this need.

SUMMARY

These and other problems are generally solved or circumvented, and technical advantages are generally achieved, by preferred embodiments of the present disclosure which provide a resonance suppression circuit for reliably turning off a high side switch device during a transition from an active mode to a standby mode.

In accordance with an embodiment, an apparatus comprises a high side switch connected between an input voltage bus and a load terminal, the load terminal being configured to be coupled to a load, a high side gate drive circuit configured to generate a gate drive signal for the high side switch, and a resonance suppression circuit having a first terminal connected to a gate of the high side switch, and a second terminal connected to the load terminal, wherein after a predetermined delay counting from a falling edge of an enable signal applied to the high side gate drive circuit, the resonance suppression circuit is configured to be active, and after a voltage on the load terminal rises above a ground voltage potential for a first time, the resonance suppression circuit is configured to pull a voltage on the gate of the high side switch down to a low voltage.

In accordance with another embodiment, a method comprises in response to a falling edge of an enable signal, configuring a high side switch to be turned off, wherein the high side switch is connected between an input voltage bus and a load terminal configured to be coupled to a load, after a predetermined delay counting from the falling edge of the enable signal, configuring a resonance suppression circuit to be active, and after a voltage on the load terminal rises above a ground voltage potential for a first time, configuring the resonance suppression circuit to pull a voltage on the gate of the high side switch down to a low voltage.

In accordance with yet another embodiment, a driver comprises a high side gate drive circuit configured to generate a gate drive signal for a high side switch connected between an input voltage bus and a load terminal configured to be coupled to a load, and a resonance suppression circuit connected between a gate of the high side switch and the load terminal, wherein after a predetermined delay counting from a falling edge of an enable signal applied to the high side gate drive circuit, the resonance suppression circuit is configured to be active, and after a voltage on the load terminal rises above a ground voltage potential for a first time, the resonance suppression circuit is configured to pull a voltage on the gate of the high side switch down to a low voltage.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 15 illustrates a flow chart of controlling the resonance suppression circuit shown in FIG. 3 in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a resonance suppression circuit for reliably turning off a high side switch during a transition from an active mode to a standby mode. The disclosure may also be applied, however, to high switches in a variety of power conversion systems. Hereinafter, various embodiments will be explained in detail with reference to the accompanying drawings.

Figure 3:
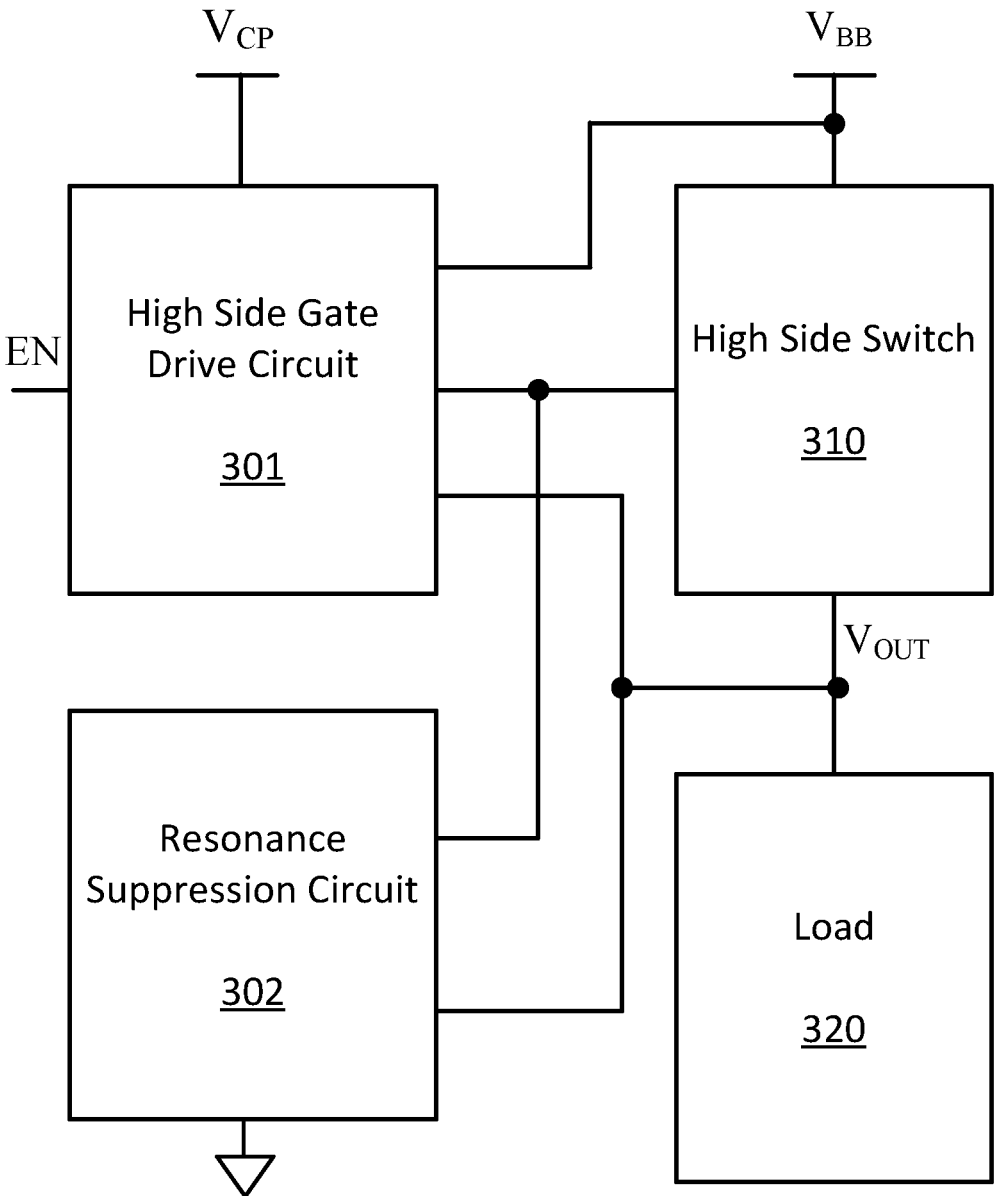
FIG. 3 illustrates a block diagram of a high side switch and the associated gate drive circuits in accordance with various embodiments of the present disclosure.

FIG. 3 illustrates a block diagram of a high side switch and the associated gate drive circuits in accordance with various embodiments of the present disclosure. The high side switch 310 is connected between an input voltage bus $V_{BB}$ and a load terminal $V_{OUT}$. A load 320 is coupled to the load terminal $V_{OUT}$. In some embodiments, the load 320 is an inductive load.

In some embodiments, the high side switch 310 is implemented as an n-type MOSFET having a drain connected to the input voltage bus $V_{BB}$ and a source connected to the load terminal $V_{OUT}$. In some applications (e.g., an automotive application), the high side switch 310 is a load switch connected between a power source (e.g., a battery) and various loads in an automotive vehicle.

As shown in FIG. 3, a high side gate drive circuit 301 is configured to receive an enable signal (EN). Based on the enable signal, the high side gate drive circuit 301 is configured to generate a gate drive signal for the high side switch 310. More particularly, in response to a logic high level of the enable signal, the high side switch is configured to be turned on. The high side switch is configured to operate in an active mode. In in response to a logic low level of the enable signal, the high side switch is configured to be turned off. The high side switch is configured to operate in a standby mode. In the standby mode, the high side switch is disabled from providing power to the load 320.

As shown in FIG. 3, the high side gate drive circuit 301 is supplied by a bias voltage $V_{CP}$. The high side gate drive circuit 301 has three input/output terminals. A first input/output terminal is connected to the input voltage bus $V_{BB}$. A second input/output terminal is connected to the high side gate drive circuit 301. In particular, the second input/output terminal is connected to a gate of the high side gate drive circuit 301. A third input/output terminal is connected to the load terminal $V_{OUT}$.

A resonance suppression circuit 302 is configured to pull a voltage on the gate of the high side switch 310 down to a low voltage (e.g., a ground voltage potential). More particularly, after a predetermined delay counting from a falling edge of the enable signal applied to the high side gate drive circuit, the resonance suppression circuit 302 is configured to be active, and after a voltage on the load terminal $V_{OUT}$ rises above the ground voltage potential for a first time, the resonance suppression circuit 302 is configured to pull the voltage on the gate of the high side switch 310 down to the low voltage (e.g., a ground voltage potential).

As shown in FIG. 3, the resonance suppression circuit 302 is connected to ground. The resonance suppression circuit 302 has two input/output terminals. A first input/output terminal of the resonance suppression circuit 302 is connected to the second input/output terminal of the high side gate drive circuit 301. A second input/output terminal of the resonance suppression circuit 302 is connected to the load terminal $V_{OUT}$.

In operation, the high side switch 310 may enter the standby mode once the enable signal changes from a logic high state to a logic low state. In the standby mode, after the predetermined delay, the resonance suppression circuit 302 is configured to be active. Furthermore, the resonance suppression circuit 302 is configured to pull the voltage on the gate of the high side switch 310 down to ground. More particularly, the resonance suppression circuit 302 senses the output voltage Vo during the standby mode. Once it detects that the output voltage Vo is high (e.g., a voltage on the load terminal $V_{OUT}$ rises above a ground voltage potential for a first time), the resonance suppression circuit 302 pulls the gate of the high side switch 310 to ground to prevent any current from flowing through the high side switch 310.

In a first embodiment of implementing the resonance suppression circuit 302, the resonance suppression circuit 302 comprises a pull-down switch and a second resistor connected in series between the gate of the high side switch 310 and ground, a Zener diode connected between the gate of the pull-down switch and ground, an enable switch coupled between the gate of the pull-down switch and ground, and a first resistor connected between the gate of the pull-down switch and the load terminal. The detailed structure and operating principle of this implementation of the will be described below with respect to FIG. 4.

In a second embodiment of implementing the resonance suppression circuit 302, the resonance suppression circuit 302 comprises a pull-down switch and a second resistor connected in series between the gate of the high side switch 310 and ground, a Zener diode connected between the gate of the pull-down switch and ground, and an enable switch and a first resistor connected in series between the gate of the pull-down switch and the load terminal. The detailed structure and operating principle of this implementation of the will be described below with respect to FIG. 6.

In a third embodiment of implementing the resonance suppression circuit 302, the resonance suppression circuit

302 comprises a pull-down switch and a second resistor connected in series between the gate of the high side switch 310 and ground, a Zener diode connected between the gate of the pull-down switch and ground, and a MOSFET connected between the gate of the pull-down switch and the load terminal. The MOSFET is configured such that the MOSFET functions as a controllable device including an enable switch and a first resistor connected in series. The detailed structure and operating principle of this implementation of the will be described below with respect to FIG. 7.

In a fourth embodiment of implementing the resonance suppression circuit 302, the resonance suppression circuit 302 comprises a pull-down switch connected between the gate of the high side switch 310 and ground, a Zener diode connected between the gate of the pull-down switch and ground, an enable switch coupled between the gate of the pull-down switch and ground, and a first resistor connected between the gate of the pull-down switch and the load terminal. The detailed structure and operating principle of this implementation of the will be described below with respect to FIG. 8.

In a fifth embodiment of implementing the resonance suppression circuit 302, the resonance suppression circuit 302 comprises a pull-down switch and a plurality of resistor-switch networks connected in series between the gate of the high side switch 310 and ground, a Zener diode connected between the gate of the pull-down switch and ground, an enable switch coupled between the gate of the pull-down switch and ground, and a first resistor connected between the gate of the pull-down switch and the load terminal. The detailed structure and operating principle of this implementation will be described below with respect to FIG. 9.

In a sixth embodiment of implementing the resonance suppression circuit 302, the resonance suppression circuit 302 comprises a pull-down switch and a second resistor connected in series between the gate of the high side switch 310 and ground, a Zener diode connected between the gate of the pull-down switch and ground, an enable switch coupled between the gate of the pull-down switch and ground, a first resistor connected between the gate of the pull-down switch and the load terminal, and a third resistor and an auxiliary switch connected in series between the gate of the pull-down switch and the load terminal. The detailed structure and operating principle of this implementation of the will be described below with respect to FIG. 10.

In a seventh embodiment of implementing the resonance suppression circuit 302, the resonance suppression circuit 302 comprises a pull-down switch and a second resistor connected in series between the gate of the high side switch 310 and ground, a Zener diode connected between the gate of the pull-down switch and ground, an enable switch coupled between the gate of the pull-down switch and ground, a first resistor connected between the gate of the pull-down switch and the load terminal, and an auxiliary switch connected between the gate of the pull-down switch and the load terminal. The detailed structure and operating principle of this implementation of the will be described below with respect to FIG. 11.

Figure 1:
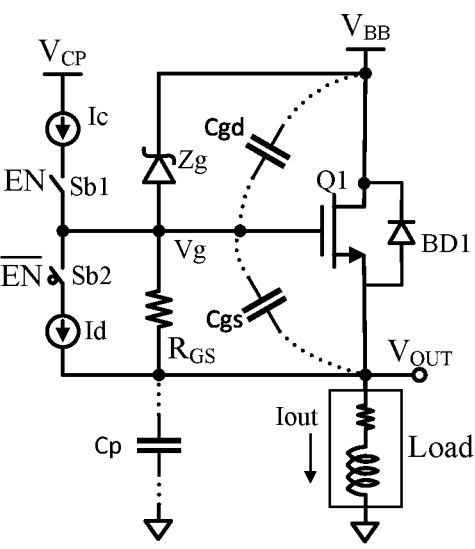
FIG. 1 illustrates a high side switch Q1 and the associated high side gate drive circuit.
Figure 4:
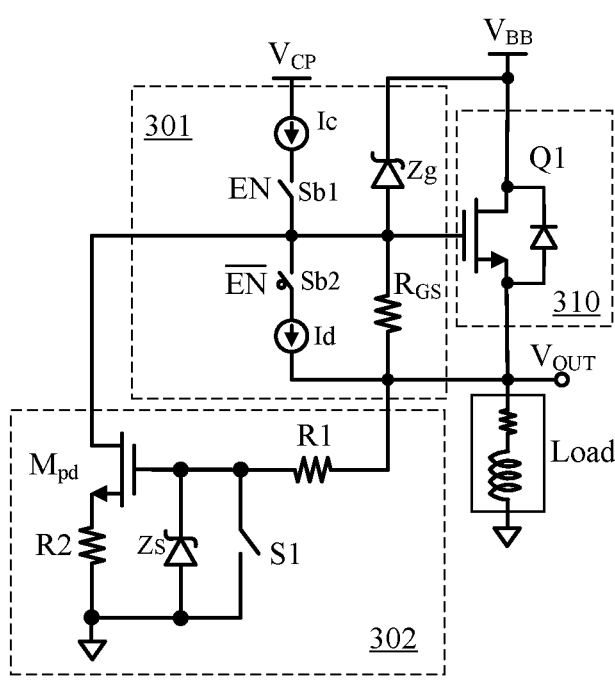
FIG. 4 illustrates a schematic diagram of a first implementation of the resonance suppression circuit shown in FIG. 3 in accordance with various embodiments of the present disclosure.

FIG. 4 illustrates a schematic diagram of a first implementation of the resonance suppression circuit shown in FIG. 3 in accordance with various embodiments of the present disclosure. The high side gate drive circuit 301 is similar to that shown in FIG. 1, and hence is not discussed in further detail herein. The high side switch 310 is implemented as an n-type power switch Q1. Throughout the description, the high side switch 310 may be alternatively referred to as a high side switch Q1. In certain applications, the load is an inductive load comprising a resistor and an inductor connected in series.

The resonance suppression circuit 302 comprises a pull-down switch Mpd, a first resistor R1, a second resistor R2, a Zener diode $Z_S$ and an enable switch S1. As shown in FIG. 4, the pull-down switch Mpd and the second resistor R2 are connected in series between the gate of the high side switch 310 and ground. The Zener diode $Z_S$ is connected between the gate of the pull-down switch Mpd and ground. The enable switch S1 is coupled between the gate of the pull-down switch Mpd and ground. The first resistor R1 is connected between the gate of the pull-down switch Mpd and the load terminal $V_{OUT}$.

In operation, during a transition from an active mode to a standby mode, in response to a falling edge of the enable signal EN, the high side switch Q1 is configured to be turned off by the second current source Id and $R_{GS}$. After a predetermined delay counting from the falling edge of the enable signal EN, the resonance suppression circuit 302 is configured to be active. Furthermore, the resonance suppression circuit 302 is configured to pull a voltage on the gate of the high side switch Q1 down to the ground voltage potential after a voltage on the load terminal $V_{OUT}$ rises above the ground voltage potential for a first time. Once the voltage on the gate of the high side switch Q1 is pulled down to the ground voltage potential, any current is prevented from flowing through Q1 to the load, thereby bringing the output voltage to zero.

Figure 5:
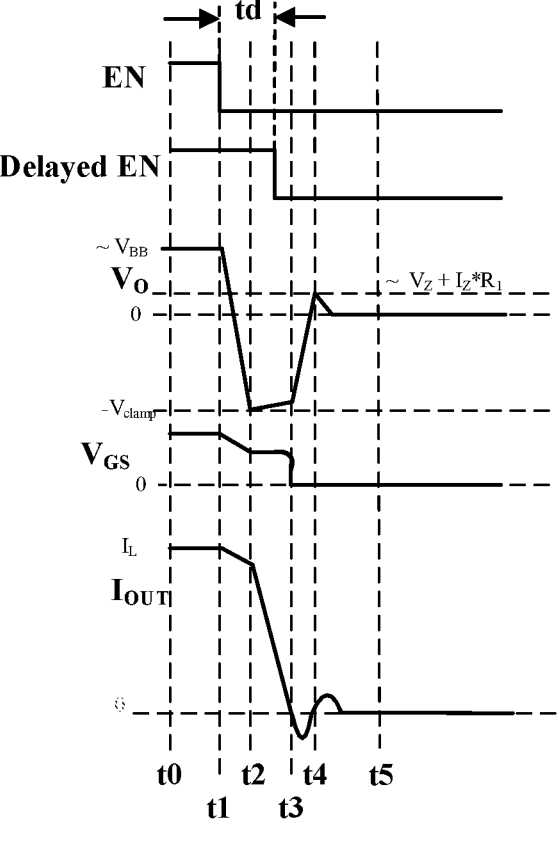
FIG. 5 illustrates various waveforms associated with the resonance suppression circuit shown in FIG. 4 in accordance with various embodiments of the present disclosure.

As shown in FIG. 4, this resonance suppression circuit 302 can be enabled and disabled by the enable switch S1 that is controlled by a delayed enable signal (not shown but illustrated in FIG. 5). The delayed enable signal has a delayed falling edge compared to the enable signal EN. As long as Q1 is in the active mode, the pull-down switch Mpd is disabled by pulling the gate of the pull-down switch Mpd to ground using the enable switch S1 that is controlled by the delayed enable signal.

As shown in FIG. 4, since the gate of the pull-down switch Mpd is connected to the load terminal $V_{OUT}$, the first resistor R1 is employed to protect the load terminal $V_{OUT}$ from being shorted to ground during the active mode. The value of the first resistor R1 can be determined by knowing the minimum load of the system and selecting the value of R1 such that it does not affect the minimum load operation. For example, the equivalent resistance value of the minimum load is equal to Rmin. The resistance value of R1 is at least ten times greater than Rmin.

As shown in FIG. 4, the Zener diode $Z_S$ is added at the gate of the pull-down switch Mpd to protect the gate from being damaged by the overstress voltage during the transition. The second resistor R2 is employed to control the pull-down current.

One advantageous feature of having the resonance suppression circuit 302 is that the gate voltage of Q1 can be reliably pulled down to the ground voltage potential after Q1 is in the standby mode. The reliable turn-off of Q1 helps to reduce or eliminate the L-C resonance, thereby protecting the components of the system (e.g., Q1 and/or the components in the load) from being damaged during the transition from the active mode to the standby mode.

FIG. 5 illustrates various waveforms associated with the resonance suppression circuit shown in FIG. 4 in accordance with various embodiments of the present disclosure. The horizontal axis of FIG. 5 represents intervals of time. There may be five rows in FIG. 5. The first row represents the enable signal EN. The second row represents the delayed enable signal. The third row represents the voltage Vo on the load terminal $V_{OUT}$. The fourth row represents the gate-source voltage of Q1. The fifth row represents the current flowing through the load.

In the transient response of Vo after the resonance suppression circuit 302 has been employed, the solution solving the resonance after Q1 is turned off includes two aspects. Firstly, the Zener diode $Z_S$ clamps the output voltage Vo so as to prevent it from rising too high after Q1 is turned off. This prevents the input voltage bus $V_{BB}$ from injecting more energy into the inductive load to fuel the L-C resonance. Secondly, while Vo is being clamped by the Zener diode $Z_S$, the pull-down switch Mpd is turned on. The turned on Mpd pulls the gate of Q1 down to ground, thereby preventing Q1 from being turned on again, thereby reducing or eliminating the subsequent L-C resonance.

As shown in FIG. 5, the falling edge of the delayed enable signal comes after the falling edge of the enable signal EN. The gap between these two falling edges is a predetermined time td as shown in FIG. 5. The duration of td is determined by the turn-off time of Q1. As shown in FIG. 5, the time duration between t2 and t1 is the turn-off time of Q1. In some embodiments, td is greater than the turn-off time of Q1. As such, the resonance suppression circuit 302 is configured such that Q1 is not turned off too fast by the discharging path comprising the pull-down switch Mpd and the second resistor R2. The turn-off slope is usually a design requirement for high side switches. The high side gate drive circuit determines the turn-off slope of Q1. In addition, the resonance suppression circuit 302 needs to be enabled by the delayed enable signal before $I_{OUT}$ drops to zero, Vo starts to rise again or Q1 becomes completely off (e.g., at the time instant t3). In other words, the resonance suppression circuit 302 needs to be enabled before t3. The resonance suppression circuit 302 is enabled by the falling edge of the delayed enable signal. As shown in FIG. 5, the falling edge of the delayed enable signal occurs at a predetermined time instant between t2 and t3.

Once the high side switch Q1 transitions from the active mode to the standby mode, the output voltage Vo is limited by the resonance suppression circuit 302. As shown in FIG. 5, the output voltage can only reach a voltage level equal to the sum of the voltage across the Zener diode $Z_S$ and the voltage across the R1 at t4. The output voltage at t4 can be expressed by the following equation:

$$Vo = Vz + Iz \times R1 \qquad (1)$$

In Equation (1), IZ is the current flowing through the Zener diode $Z_S$. $V_Z$ is the voltage across the Zener diode $Z_S$. At t4, the output voltage Vo is more than enough to turn on the pull-down switch Mpd and immediately discharge the gate of Q1 so as to turn off Q1 with no more output voltage oscillations. As shown in FIG. 5, at t4, the output voltage Vo starts to drop. Once the output voltage Vo reaches zero, the L-C resonance stops.

As shown in FIG. 5, the resonance suppression circuit 302 not only limits the value of Vo after t3, but also holds the gate-source voltage $V_{GS}$ to zero after t3 to prevent Q1 from being turned on repeatedly.

One advantageous feature of having the resonance suppression circuit 302 is that the resonance suppression circuit 302 provides a reliable and effective solution to protect the high side switch Q1 during the transition from an active mode (Q1 is turned on) to a standby mode (Q1 is turned off) while easing the current limit design.

Figure 6:
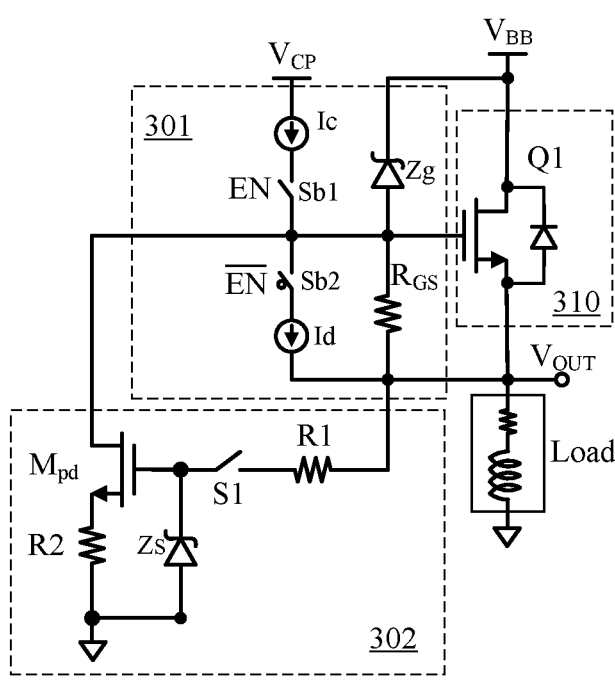
FIG. 6 illustrates a schematic diagram of a second implementation of the resonance suppression circuit shown in FIG. 3 in accordance with various embodiments of the present disclosure.

FIG. 6 illustrates a schematic diagram of a second implementation of the resonance suppression circuit shown in FIG. 3 in accordance with various embodiments of the present disclosure. The second implementation of the resonance suppression circuit 302 shown in FIG. 6 is similar to the first implementation of the resonance suppression circuit 302 shown in FIG. 4 except that the enable switch S1 and the first resistor R1 are connected in series between the gate of the pull-down switch Mpd and the load terminal $V_{OUT}$.

Figure 2:
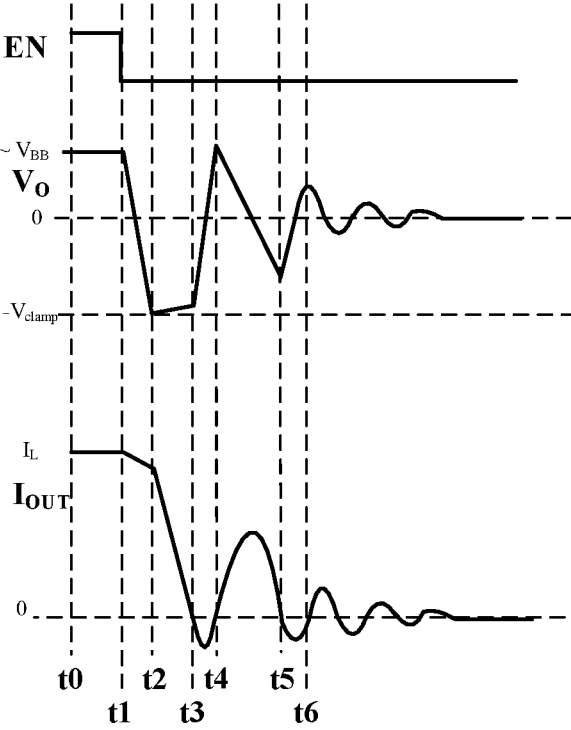
FIG. 2 illustrates various waveforms associated with the high side gate drive circuit shown in FIG. 1.

In operation, the high side switch Q1 is configured to be disabled from powering the load in response to a falling edge of the enable signal EN. The enable switch S1 is configured to be turned on after a predetermined delay (e.g., td shown in FIG. 5) counting from the falling edge of the enable signal EN. In response to the turn-on of the enable switch S1, the voltage on the load terminal $V_{OUT}$ is applied to the gate of the pull-down switch Mpd. The pull-down switch Mpd is turned on after the voltage on the load terminal rises above the ground voltage potential to pull the gate of Q1 down to a ground voltage potential, thereby preventing Q1 from being turned on repeatedly as shown in FIG. 2.

Figure 7:
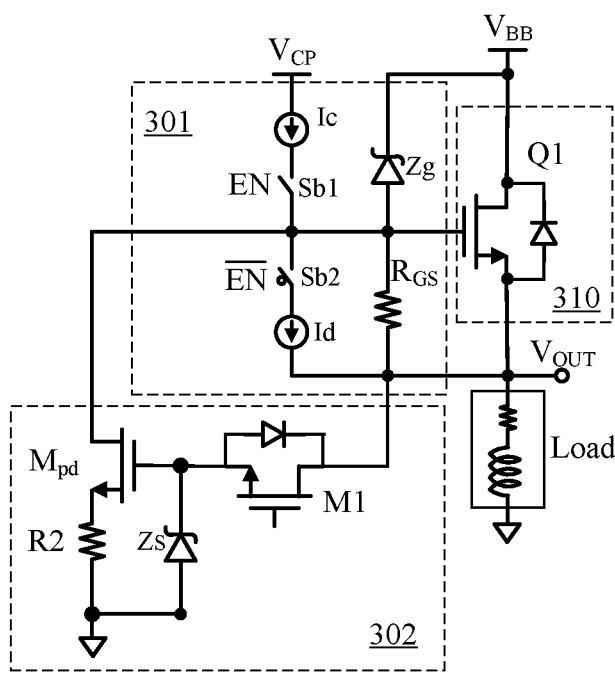
FIG. 7 illustrates a schematic diagram of a third implementation of the resonance suppression circuit shown in FIG. 3 in accordance with various embodiments of the present disclosure.

FIG. 7 illustrates a schematic diagram of a third implementation of the resonance suppression circuit shown in FIG. 3 in accordance with various embodiments of the present disclosure. The third implementation of the resonance suppression circuit 302 shown in FIG. 7 is similar to the second implementation of the resonance suppression circuit 302 shown in FIG. 6 except that the enable switch S1 and the resistor R1 can be combined into one MOSFET (e.g., M1 shown in FIG. 7). The MOSFET M1 is biased to be turned off before the falling edge of the enable signal EN. After a predetermined delay counting from the falling edge of the enable signal EN, the MOSFET M1 is biased in a linear region such that the MOSFET M1 behaves like a variable resistor. Furthermore, the bias of the MOSFET M1 can be adjusted to control the slew rate of the pull-down switch Mpd.

Figure 8:
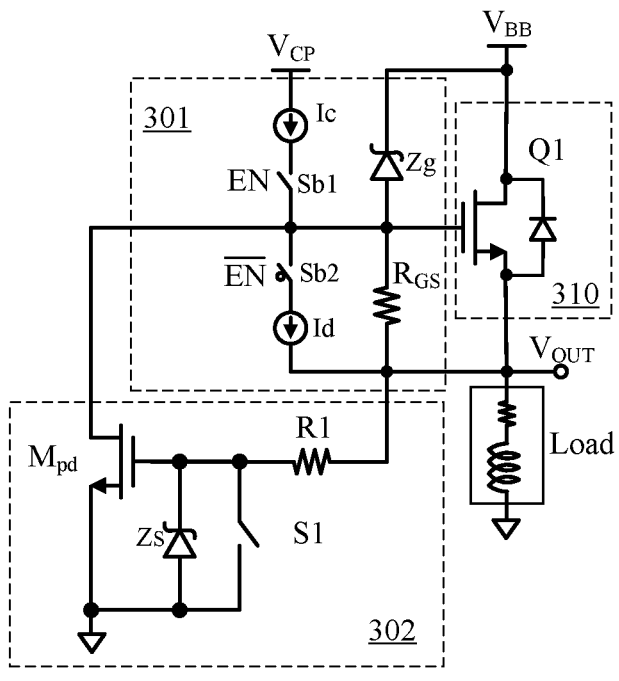
FIG. 8 illustrates a schematic diagram of a fourth implementation of the resonance suppression circuit shown in FIG. 3 in accordance with various embodiments of the present disclosure.

FIG. 8 illustrates a schematic diagram of a fourth implementation of the resonance suppression circuit shown in FIG. 3 in accordance with various embodiments of the present disclosure. The fourth implementation of the resonance suppression circuit 302 shown in FIG. 8 is similar to the first implementation of the resonance suppression circuit 302 shown in FIG. 4 except that the resonance suppression circuit 302 does not include the second resistor R2. As shown in FIG. 8, the pull-down switch Mpd has a first drain/source terminal (e.g., a drain) connected to the gate of the high side switch Q1 and a second drain/source terminal (e.g., a source) connected to ground. The operating principle of the third implementation of the resonance suppression circuit 302 shown in FIG. 8 is similar to that of the first implementation of the resonance suppression circuit 302 shown in FIG. 4, and hence is not discussed herein to avoid repetition.

Figure 9:
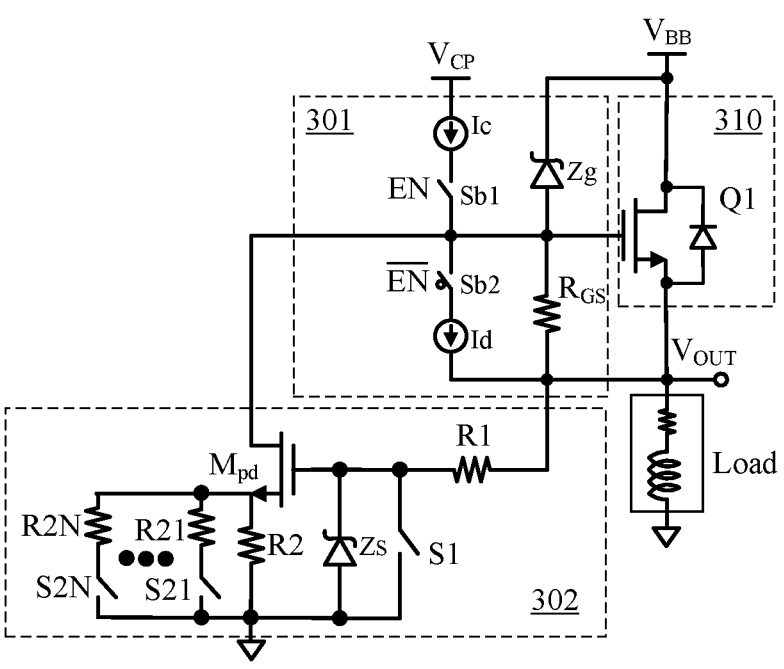
FIG. 9 illustrates a schematic diagram of a fifth implementation of the resonance suppression circuit shown in FIG. 3 in accordance with various embodiments of the present disclosure.

FIG. 9 illustrates a schematic diagram of a fifth implementation of the resonance suppression circuit shown in FIG. 3 in accordance with various embodiments of the present disclosure. The fifth implementation of the resonance suppression circuit 302 shown in FIG. 9 is similar to the first implementation of the resonance suppression circuit 302 shown in FIG. 4 except that a plurality of resistor-capacitor networks is employed to further improve the performance of the resonance suppression circuit 302.

As shown in FIG. 9, a plurality of resistor-switch networks is connected in parallel with the second resistor R2.

The plurality of resistor-switch networks includes N resistor-switch networks. As shown in FIG. 9, a first resistor-switch network comprises a resistor R21 and a switch S21 connected in series. An nth resistor-switch network comprises a resistor R2N and a switch S2N connected in series. In operation, the plurality of resistor-switch networks is configured such that a current flowing through the pull-down switch Mpd is dynamically adjustable.

Figure 10:
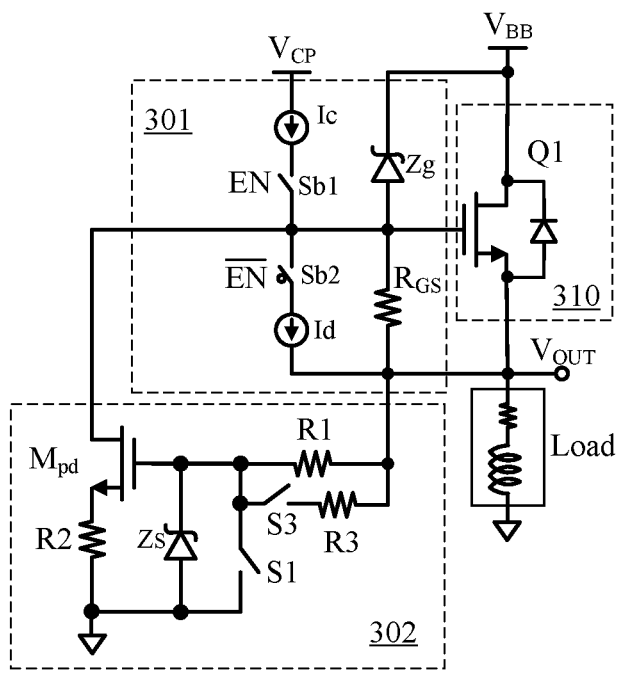
FIG. 10 illustrates a schematic diagram of a sixth implementation of the resonance suppression circuit shown in FIG. 3 in accordance with various embodiments of the present disclosure.

FIG. 10 illustrates a schematic diagram of a sixth implementation of the resonance suppression circuit shown in FIG. 3 in accordance with various embodiments of the present disclosure. The sixth implementation of the resonance suppression circuit 302 shown in FIG. 10 is similar to the first implementation of the resonance suppression circuit 302 shown in FIG. 4 except that a third resistor R3 and an auxiliary switch S3 are employed to further improve the performance of the resonance suppression circuit 302. As shown in FIG. 10, the auxiliary switch S3 and the third resistor R3 are connected in series between the gate of the pull-down switch Mpd and the load terminal $V_{OUT}$.

In operation, after a predetermined delay counting from the falling edge of the enable signal EN, the enable switch S1 is configured to be turned off. In response to the voltage of the load terminal rising above the ground potential, the pull-down switch Mpd is configured to be turned on to pull the voltage on the gate of the high side switch Q1 down to the ground voltage potential. During the process of turning on the pull-down switch Mpd, a turn-on time of the auxiliary switch S3 is modulated such that a slew rate of a voltage on the gate of the pull-down switch Mpd is dynamically adjustable.

Figure 11:
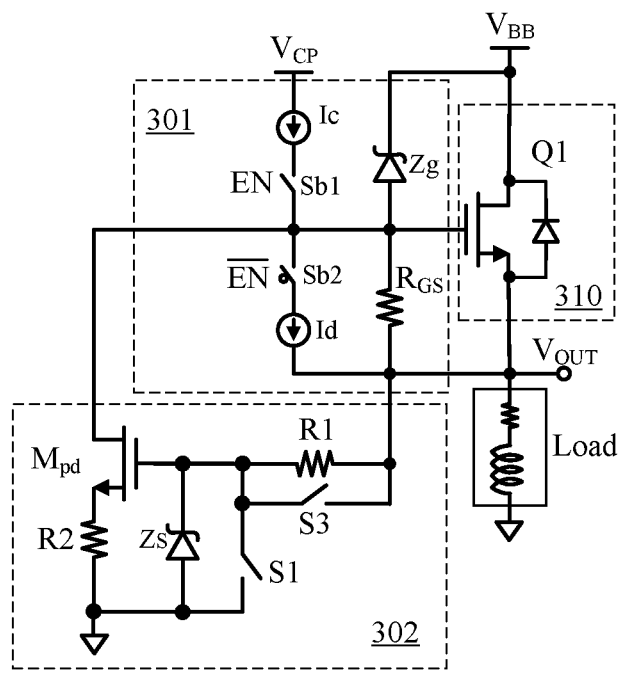
FIG. 11 illustrates a schematic diagram of a seventh implementation of the resonance suppression circuit shown in FIG. 3 in accordance with various embodiments of the present disclosure.

FIG. 11 illustrates a schematic diagram of a seventh implementation of the resonance suppression circuit shown in FIG. 3 in accordance with various embodiments of the present disclosure. The seventh implementation of the resonance suppression circuit 302 shown in FIG. 11 is similar to the first implementation of the resonance suppression circuit 302 shown in FIG. 4 except that an auxiliary switch S3 is employed to further improve the performance of the resonance suppression circuit 302. As shown in FIG. 11, the auxiliary switch S3 is connected between the gate of the pull-down switch Mpd and the load terminal. The auxiliary switch S3 can also be implemented as a MOSFET biased to operate in the linear region. In operation, the auxiliary switch S3 is configured to have its bias voltage to be adjusted such that a slew rate of a voltage on the gate of the pull-down switch Mpd is dynamically adjustable, essentially combining the function of the auxiliary switch S3 and the function of the resistor R3 shown in FIG. 10 into one MOSFET S3.

Figure 12:
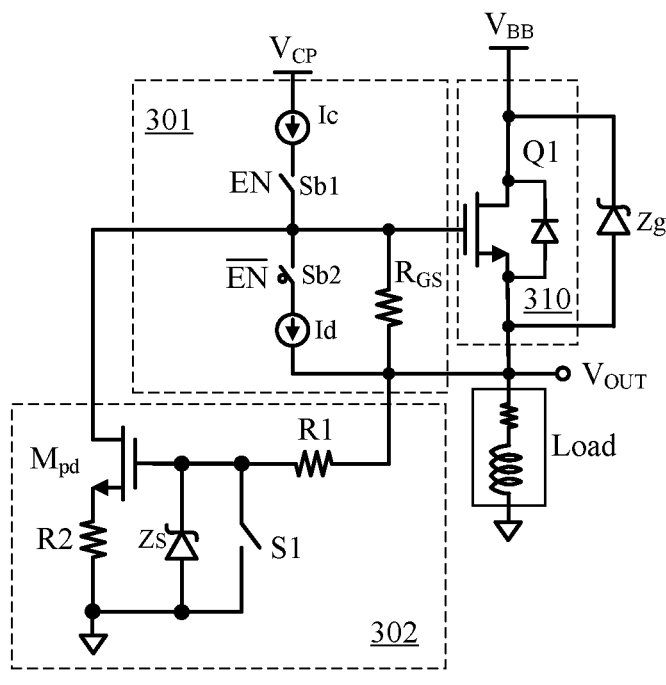
FIG. 12 illustrates a schematic diagram of another implementation of the high side gate drive circuit shown in FIG. 3 in accordance with various embodiments of the present disclosure.

FIG. 12 illustrates a schematic diagram of another implementation of the high side gate drive circuit shown in FIG. 3 in accordance with various embodiments of the present disclosure. The high side gate drive circuit 301 shown in FIG. 12 is similar to the high side gate drive circuit 301 shown in FIG. 4 except that the Zener diode Zg is connected between the drain and source of the high side switch Q1. Under this system configuration, the Zener diode Zg act as a drain-source voltage clamp, which limits the voltage across the drain and source terminal of the high side switch Q1. This drain-source voltage clamp limits how low below the ground potential the voltage on the load terminal can dip such that the high side switch Q1 is protected from being damaged by excessive voltage across its drain and source terminals during all operating conditions.

In the embodiments described above with respect to FIGS. 4-12, Zener diodes $Z_S$ and Zg function as voltage clamping devices. The implementation of $Z_S$ and Zg above is merely an example, which should not unduly limit the scope of the claims. One of ordinary skill in the art would recognize many variations, alternatives, and modifications. For example, the voltage clamping device can be implemented as a plurality of diodes and/or Zener diodes connected in series as shown in FIGS. 13 and 14.

Figure 13:
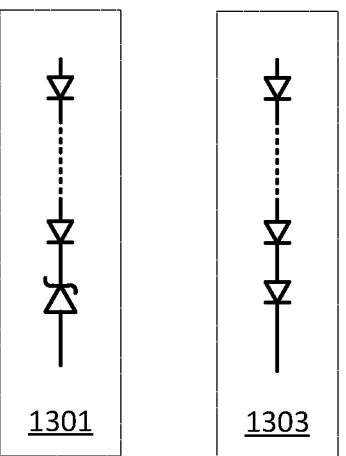
FIG. 13 illustrates a first group of implementations of the voltage clamping device in accordance with various embodiments of the present disclosure.

FIG. 13 illustrates a first group of implementations of the voltage clamping device in accordance with various embodiments of the present disclosure. In a first implementation 1301, the voltage clamping device may comprise a plurality of diodes and a Zener diode connected in series. As shown in FIG. 13, a cathode of a diode is connected to an anode of an adjacent diode. The plurality of diodes is connected in series. A cathode of the bottommost diode is connected to a cathode of the Zener diode. In a second implementation 1303, the voltage clamping device may comprise a plurality of diodes connected in series. As shown in FIG. 13, a cathode of a diode is connected to an anode of an adjacent diode.

It should be noted that each diode or Zener diode shown in FIG. 13 can be implemented as other suitable semiconductor devices such as a diode-connected MOSFET. It should further be noted that the plurality of implementations of the voltage clamping device shown in FIG. 13 is applicable to all embodiments of the present disclosure.

Figure 14:
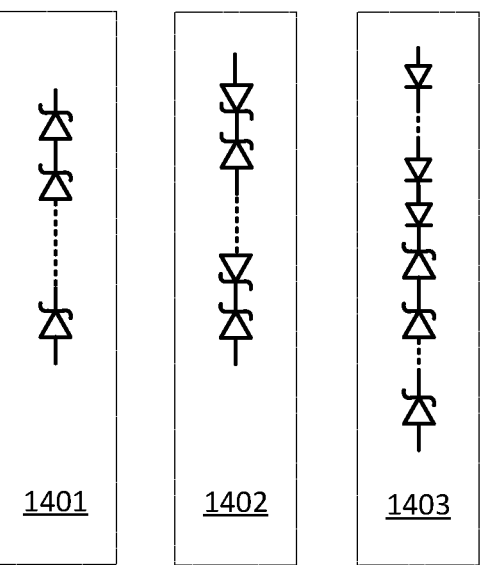
FIG. 14 illustrates a second group of implementations of the voltage clamping device in accordance with various embodiments of the present disclosure.

FIG. 14 illustrates a second group of implementations of the voltage clamping device in accordance with various embodiments of the present disclosure. In a first implementation 1401, the voltage clamping device may comprise a plurality of Zener didoes connected in series. As shown in FIG. 14, a cathode of a Zener diode is connected to an anode of an adjacent Zener diode. In a second implementation 1402, the voltage clamping device may comprise a plurality of Zener didoes connected in series. At least two Zener diodes are back-to-back connected as shown in FIG. 14. The back-to-back connection of the Zener diodes is insensitive to temperature changes. As such, the second implementation of the voltage clamping device helps to improve the performance of the voltage clamping device under various operating conditions. In a third implementation 1403, the voltage clamping device may comprise a plurality of diodes and a plurality of Zener didoes connected in series. The specific combination of the diodes and Zener didoes is determined according to the required clamping threshold voltage value.

It should be noted that each diode shown in FIG. 14 can be implemented as other suitable semiconductor devices such as a diode-connected MOSFET. It should be noted that the plurality of implementations of the voltage clamping device shown in FIG. 14 is applicable to all embodiments of the present disclosure.

FIG. 15 illustrates a flow chart of controlling the resonance suppression circuit shown in FIG. 3 in accordance with various embodiments of the present disclosure. This flowchart shown in FIG. 15 is merely an example, which should not unduly limit the scope of the claims. One of ordinary skill in the art would recognize many variations, alternatives, and modifications. For example, various steps illustrated in FIG. 15 may be added, removed, replaced, rearranged and repeated.

At step 1502, in response to a falling edge of an enable signal, a high side switch is configured to be turned off. The high side switch is connected between an input voltage bus and a load terminal configured to be coupled to a load.

At step 1504, after a predetermined delay counting from the falling edge of the enable signal, a resonance suppression circuit is configured to be active.

At step 1506, after a voltage on the load terminal rises above a ground voltage potential for a first time, the resonance suppression circuit is configured to pull a voltage on the gate of the high side switch down to a low voltage.

Referring back to FIG. 4, the resonance suppression circuit comprises a pull-down switch coupled between the gate of the high side switch and ground, a first resistor coupled between the gate of the pull-down switch and the load terminal, and an enable switch coupled between the gate of the pull-down switch and ground.

Referring back to FIG. 4, the method further comprises after the predetermined delay counting from the falling edge of the enable signal, configuring the enable switch to be turned off and configuring the pull-down switch to be turned on to pull the voltage on the gate of the high side switch down to the low voltage, wherein the pull-down switch is turned on after the voltage on the load terminal rises above a turn-on threshold of the pull-down switch.

Referring back to FIG. 6, the resonance suppression circuit comprises a pull-down switch coupled between the gate of the high side switch and ground, and an enable switch and a first resistor coupled between the gate of the pull-down switch and the load terminal.

Referring back to FIG. 6, the method further comprises, after the predetermined delay counting from the falling edge of the enable signal, configuring the enable switch to be turned on and configuring the pull-down switch to be turned on to pull the voltage on the gate of the high side switch down to the low voltage after the voltage on the load terminal rises above a turn-on threshold of the pull-down switch.

Referring back to FIG. 7, the resonance suppression circuit comprises a pull-down switch coupled between the gate of the high side switch and ground, an enable switch coupled between the gate of the pull-down switch and ground, and a MOSFET switch coupled between the gate of the pull-down switch and the load terminal.

Referring back to FIG. 7, the method further comprises configuring the MOSFET switch to be turned off before the falling edge of the enable signal, after the predetermined delay counting from the falling edge of the enable signal, configuring the enable switch to be turned off and configuring the pull-down switch to be turned on to pull the voltage on the gate of the high side switch down to the low voltage, and after the predetermined delay counting from the falling edge of the enable signal, configuring the MOSFET switch to function as a variable resistor such that a slew rate of a voltage on the gate of the pull-down switch is dynamically adjustable.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a high side switch connected between an input voltage bus and a load terminal, the load terminal being configured to be coupled to a load;
   a high side gate drive circuit configured to generate a gate drive signal for the high side switch; and
   a resonance suppression circuit having a first terminal connected to a gate of the high side switch, and a second terminal connected to the load terminal,
      wherein the resonance suppression circuit is configured to enter an enabled state in response to a second enable signal, the second enable signal being asserted upon expiration of a predetermined delay duration counting from a falling edge of a first enable signal applied to the high side gate drive circuit,
      and wherein, subsequent to entering the enabled state and in response to detecting that a voltage on the load terminal rises above a ground voltage potential for a first time, the resonance suppression circuit is configured to actuate a switch to pull a voltage on the gate of the high side switch down to a low voltage, and wherein a first drain/source terminal of the switch is directly connected to the gate of the high side switch, and a second drain/source terminal of the switch is coupled to ground.

2. The apparatus of claim 1, wherein the resonance suppression circuit comprises:
   the switch, wherein the switch is a pull-down switch;
   a first resistor coupled between the gate of the pull-down switch and the load terminal; and
   an enable switch coupled to the gate of the pull-down switch.

3. The apparatus of claim 2, further comprising a second resistor and a first Zener diode, wherein:
   the first Zener diode is coupled between a gate of the pull-down switch and ground;
   the pull-down switch and the second resistor are connected in series between the gate of the high side switch and ground; and
   the enable switch is connected between the gate of the pull-down switch and ground, and wherein:
      the high side switch is configured to be disabled from powering the load in response to the falling edge of the first enable signal; and
      the enable switch is configured to be turned off after the predetermined delay counting from the falling edge of the first enable signal.

4. The apparatus of claim 2, further comprising a second resistor and a first Zener diode, wherein:
   the first Zener diode is coupled between a gate of the pull-down switch and ground;
   the pull-down switch and the second resistor are connected in series between the gate of the high side switch and ground; and
   the enable switch and the first resistor are connected in series between the gate of the pull-down switch and the load terminal, and wherein:
      the high side switch is configured to be disabled from powering the load in response to the falling edge of the first enable signal; and
      the enable switch is configured to be turned on after the predetermined delay counting from the falling edge of the first enable signal.

5. The apparatus of claim 2, further comprising a first Zener diode, wherein:
   the first Zener diode is coupled between a gate of the pull-down switch and ground;
   the pull-down switch has a first drain/source terminal connected to the gate of the high side switch and a second drain/source terminal connected to ground; and
   the enable switch is connected between the gate of the pull-down switch and ground, and wherein:
      the high side switch is configured to be disabled from powering the load in response to the falling edge of the first enable signal; and
      the enable switch is configured to be turned off after the predetermined delay counting from the falling edge of the first enable signal.

6. The apparatus of claim 2, further comprising a second resistor, a plurality of resistor-switch networks connected in parallel with the second resistor and a first Zener diode, wherein:
   the first Zener diode is coupled between a gate of the pull-down switch and ground;
   the pull-down switch and the second resistor are connected in series between the gate of the high side switch and ground, and wherein the plurality of resistor-switch networks is configured such that a current flowing through the pull-down switch is dynamically adjustable; and
   the enable switch is connected between the gate of the pull-down switch and ground, and wherein:
      the high side switch is configured to be disabled from powering the load in response to the falling edge of the first enable signal; and
      the enable switch is configured to be turned off after the predetermined delay counting from the falling edge of the first enable signal.

7. The apparatus of claim 2, further comprising a second resistor, a third resistor, an auxiliary switch and a first Zener diode, wherein:
   the first Zener diode is coupled between a gate of the pull-down switch and ground;
   the pull-down switch and the second resistor are connected in series between the gate of the high side switch and ground;
   the auxiliary switch and the third resistor are connected in series between the gate of the pull-down switch and the load terminal, wherein the auxiliary switch is configured such that a slew rate of a voltage on the gate of the pull-down switch is dynamically adjustable; and
   the enable switch is connected between the gate of the pull-down switch and ground, and wherein:
      the high side switch is configured to be disabled from powering the load in response to the falling edge of the first enable signal; and
      the enable switch is configured to be turned off after the predetermined delay counting from the falling edge of the first enable signal.

8. The apparatus of claim 2, further comprising an auxiliary switch and a first Zener diode, wherein:
   the first Zener diode is coupled between a gate of the pull-down switch and ground;
   the auxiliary switch is connected in parallel with the first resistor, wherein the auxiliary switch is configured such that a slew rate of a voltage on the gate of the pull-down switch is dynamically adjustable; and
   the enable switch is connected between the gate of the pull-down switch and ground, and wherein:

the high side switch is configured to be disabled from powering the load in response to the falling edge of the first enable signal; and the enable switch is configured to be turned off after the predetermined delay counting from the falling edge of the first enable signal.

9. The apparatus of claim 2, further comprising a first Zener diode and a plurality of diodes, wherein:

the plurality of diodes and the first Zener diode are connected in series between the gate of the pull-down switch and ground.

10. The apparatus of claim 1, wherein:

the load is an inductive load; and the low voltage is approximately equal to the ground voltage potential.

11. A method comprising:

in response to a falling edge of a first enable signal, configuring a high side switch to be turned off, wherein the high side switch is connected between an input voltage bus and a load terminal configured to be coupled to a load;

configuring a resonance suppression circuit to enter an enabled state in response to a second enable signal, the second enable signal being asserted upon expiration of a predetermined delay duration counting from the falling edge of the first enable signal; and after entering the enabled state and in response to detecting that a voltage on the load terminal rises above a ground voltage potential for a first time, configuring the resonance suppression circuit to actuate a switch to pull a voltage on the gate of the high side switch down to a low voltage, and wherein a first drain/source terminal of the switch is directly connected to the gate of the high side switch, and a second drain/source terminal of the switch is coupled to ground.

12. The method of claim 11, wherein the resonance suppression circuit comprises:

the switch, wherein the switch is a pull-down switch;

a first resistor coupled between the gate of the pull-down switch and the load terminal; and an enable switch coupled between the gate of the pull-down switch and ground.

13. The method of claim 12, further comprising:

after the predetermined delay counting from the falling edge of the first enable signal, configuring the enable switch to be turned off and configuring the pull-down switch to be turned on to pull the voltage on the gate of the high side switch down to the low voltage, wherein the pull-down switch is turned on after the voltage on the load terminal rises above a turn-on threshold of the pull-down switch.

14. The method of claim 11, wherein the resonance suppression circuit comprises:

the switch, wherein the switch is a pull-down switch; and an enable switch and a first resistor coupled between the gate of the pull-down switch and the load terminal.

15. The method of claim 14, further comprising:

after the predetermined delay counting from the falling edge of the first enable signal, configuring the enable switch to be turned on and configuring the pull-down switch to be turned on to pull the voltage on the gate of the high side switch down to the low voltage after the voltage on the load terminal rises above a turn-on threshold of the pull-down switch.

16. The method of claim 11, wherein the resonance suppression circuit comprises:

the switch, wherein the switch is a pull-down switch;

an enable switch coupled between the gate of the pull-down switch and ground; and a MOSFET switch coupled between the gate of the pull-down switch and the load terminal.

17. The method of claim 16, further comprising:

configuring the MOSFET switch to be turned off before the falling edge of the first enable signal;

after the predetermined delay counting from the falling edge of the first enable signal, configuring the enable switch to be turned off and configuring the pull-down switch to be turned on to pull the voltage on the gate of the high side switch down to the low voltage; and after the predetermined delay counting from the falling edge of the first enable signal, configuring the MOSFET switch to function as a variable resistor such that a slew rate of a voltage on the gate of the pull-down switch is dynamically adjustable.

18. A driver comprising:

a high side gate drive circuit configured to generate a gate drive signal for a high side switch connected between an input voltage bus and a load terminal configured to be coupled to a load; and a resonance suppression circuit connected between a gate of the high side switch and the load terminal, wherein the resonance suppression circuit is configured to enter an enabled state in response to a second enable signal, the second enable signal being asserted upon expiration of a predetermined delay duration counting from a falling edge of a first enable signal applied to the high side gate drive circuit, and wherein, subsequent to entering the enabled state and in response to detecting that a voltage on the load terminal rises above a ground voltage potential for a first time, the resonance suppression circuit is configured to actuate a switch to pull a voltage on the gate of the high side switch down to a low voltage, and wherein a first drain/source terminal of the switch is directly connected to the gate of the high side switch, and a second drain/source terminal of the switch is coupled to ground.

19. The driver of claim 18, wherein:

the resonance suppression circuit comprises:

the switch, wherein the switch is a pull-down switch;

at least a diode coupled between a gate of the pull-down switch and ground;

a first resistor coupled between the gate of the pull-down switch and the load terminal; and an enable switch coupled between the gate of the pull-down switch and ground; and the high side gate drive circuit comprises:

a first bias switch and a second bias switch coupled in series between a bias voltage bus and the load terminal, and wherein a common node of the first bias switch and the second bias switch is connected to the gate of the high side switch; and a gate drive resistor connected between the gate of the high side switch and the load terminal.

20. The driver of claim 19, further comprising a second Zener diode, wherein:

the at least a diode is a first Zener diode;

the second Zener diode is connected between the input voltage bus and the gate of the high side switch;

the load is an inductive load; and the low voltage is approximately equal to the ground voltage potential.

21. The driver of claim 19, further comprising a second Zener diode, wherein:

the at least a diode is a first Zener diode;

the second Zener diode is connected between the input
voltage bus and the load terminal;

the load is an inductive load; and the low voltage is approximately equal to the ground
voltage potential.

\* \* \* \* \*